United States Patent [19]

Ishihara et al.

[11] Patent Number: 4,772,486
[45] Date of Patent: Sep. 20, 1988

[54] PROCESS FOR FORMING A DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[21] Appl. No.: 113,414

[22] Filed: Oct. 27, 1987

Related U.S. Application Data

[63] Continuation of Ser. No. 829,791, Feb. 14, 1986, abandoned.

[30] Foreign Application Priority Data

Feb. 18, 1985 [JP] Japan .................................. 60-29810
Feb. 18, 1985 [JP] Japan .................................. 60-29811
Feb. 18, 1985 [JP] Japan .................................. 60-29812
Feb. 18, 1985 [JP] Japan .................................. 60-29813

[51] Int. Cl.$^4$ .............................................. B05D 3/06
[52] U.S. Cl. ...................................... 427/39; 437/173; 437/234
[58] Field of Search ................ 427/86, 87, 39, 45.1; 437/173, 234

[56] References Cited

U.S. PATENT DOCUMENTS

Re. 31,708 10/1984 Gordon ........................... 427/126.2
3,271,180  9/1966 White .
3,288,829 11/1966 Wilkinson .
3,473,978 10/1969 Jackson et al. ..................... 148/175
3,888,705  6/1975 Fletcher ........................... 148/175
3,907,616  9/1975 Wiemer ............................ 148/188

(List continued on next page.)

FOREIGN PATENT DOCUMENTS 74212    3/1983 European Pat. Off. .
90586A  10/1983 European Pat. Off. .
59-199035 12/1984 Japan .
60-43819  8/1985 Japan .
2038086A  7/1980 United Kingdom .
2148328A  5/1985 United Kingdom .

OTHER PUBLICATIONS

Inoue, Appl. Phys. Lett. 43(8), 15 Oct. 83, p. 774.
Ohnishi et al., Proceedings, 6th E.C. Photovoltaic Solar Energy Conference, London, Apr. 15-19, 1985.
Sakai et al., Proceedings, 6th E.C. Photovoltaic Solar Energy Conference, London, Apr. 15-19, 1985.
Brodsky et al., "IBM Tech. Disc. Bull." vol. 22 No. 8A Jan. 1980 pp. 3391,2.

Primary Examiner—John H. Newsome
Attorney, Agent, or Firm—Fitzpatrick, Cella, Harper & Scinto

[57] ABSTRACT

A process for forming a deposited film, which comprises introducing, into a film forming space for forming said deposited film on a substrate, compounds A-1 and B-1 respectively represented by following general formulae and employed as raw materials for said deposited film:

$$R_n M^1_m \qquad (A-1)$$

$$A^1_a B_b \qquad (B-1)$$

and active species capable of effecting a chemical reaction with at least one of said compounds, thereby forming a deposited film on said substrate, wherein m is a positive integer equal to the valence of R or a multiple thereof, n is a positive integer equal to the valence of $M^1$ or a multiple thereof, $M^1$ stands for an element of the group III of the periodic table, R stands for a hydrogen atom (H), a halogen atom (X) or a hydrocarbon group, a is a positive integer equal to the valence of B or a multiple thereof, b is a positive integer equal to the valence of $A^1$ or a multiple thereof, $A^1$ stands for an element of the group V of the periodic table, and B stands for a hydrogen atom (H), a halogen atom (X) or a hydrocarbon group.

12 Claims, 1 Drawing Sheet

U.S. PATENT DOCUMENTS

| | | | |
|---|---|---|---|
| 3,914,515 | 10/1975 | Kane. | |
| 4,042,006 | 8/1977 | Engl et al. . | |
| 4,146,657 | 3/1979 | Gordon | 427/126 |
| 4,147,571 | 4/1979 | Stringfellow | 148/175 |
| 4,220,488 | 9/1980 | Duchemin et al. . | |
| 4,239,811 | 12/1980 | Kemlage | 427/95 |
| 4,321,073 | 3/1982 | Blair . | |
| 4,357,179 | 11/1982 | Adams et al. | 148/1.5 |
| 4,402,762 | 9/1983 | John et al. | 148/1.5 |
| 4,421,592 | 12/1983 | Shaskus et al. | 156/613 |
| 4,422,888 | 12/1985 | Stutius | 148/175 |
| 4,448,801 | 5/1984 | Fukuda et al. | 427/39 |
| 4,462,847 | 7/1984 | Thompson et al. | 148/174 |
| 4,504,329 | 3/1985 | Quinlan | 148/175 |
| 4,504,518 | 3/1985 | Ovshinsky et al. | 427/38 |
| 4,509,997 | 4/1985 | Cockayne | 148/175 |
| 4,522,663 | 6/1985 | Ovshinsky et al. | 148/403 |
| 4,532,199 | 7/1985 | Ueno et al. | 427/37 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/87 |
| 4,652,463 | 3/1987 | Peters | 427/53.1 |
| 4,657,777 | 4/1987 | Hirooka et al. . | |
| 4,689,093 | 8/1987 | Ishihara et al. | 437/5 |

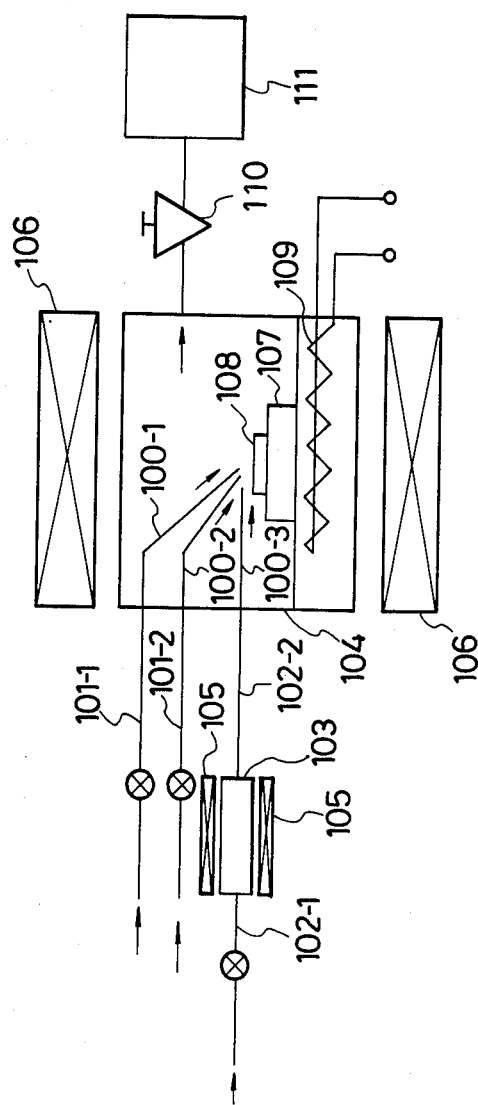

PROCESS FOR FORMING A DEPOSITED FILM

This application is a continuation of application Ser. No. 829,791 filed Feb. 14, 1986, now abandoned

BACKGROUND OF THE INVENTION

1. Field of the Invention

The present invention relates to a process for forming an amorphous or crystalline functional film for a semiconductor, insulator, conductor, etc., and in particular a deposited film adapted for use in an active or passive semiconductor device, an optical semiconductor device, a solar cell or an electrophotographic photosensitive device.

2. Description of the Prior Art

A deposited film can be obtained by various processes such as vacuum evaporation, plasma CVD, thermal CVD, photo CVD, reactive sputtering, ion plating etc., among which the plasma CVD process is widely employed for commercial purpose.

However, for application in electronic or optoelectronic devices of higher performance, the deposited films obtained with such processes still have a room for improvements in overall characteristics, including electrical and optical properties, resistance fatigue due to environmental conditions and repeated usage. Further, improvement in productivity and mass productivity including uniformity and reproducibility is desired.

The reaction process in the film formation by the plasma CVD process conventionally employed is considerably more complex than that in the so-called thermal CVD process and is not yet clarified in detail. Also the formation of the deposited film depends on a number of parameters such as the substrate temperature, flow rates and ratio of introduced gasses, pressure at the film formation, high-frequency electric power, electrode structure, reactor structure, gas exhaust rate, plasma generating method etc., which, in combination, may give rise to unstable plasma, thus often resulting in significant undesirable affects on the deposited film. Besides it has been difficult to uniformalize the manufacturing conditions since certain parameters have to be selected for each apparatus employed.

For the preparation of an amorphous silicon film, the plasma CVD process is currently regarded as best, since it can provide electrical and optical properties at levels satisfactorily acceptable in various applications.

However, for achieving reproducible mass production of a film of a large area with uniform thickness and quality for certain applications, the plasma CVD process requires a significant investment in the apparatus, involving complex controls, tight tolerances, and subtle adjustments. These matters have been pointed out as the problems to be improved in the future.

On the other hand, the conventional CVD technology requires the use of a high temperature, and still is not necessarily capable, on a commercial scale, of providing a deposited film with satisfactory characteristics.

These unsolved problems are particularly marked in preparing a thin film of compounds of group II-IV and group III-V elements.

For these reasons there has been desired a process for forming a functional film in an inexpensive apparatus, while maintaining acceptable characteristics and uniformity in practice.

SUMMARY OF THE INVENTION

In consideration of the foregoing, an object of the present invention is to eliminate the drawbacks in the conventional processes and to provide a novel process for forming a deposited film different from the conventional processes.

Another object of the present invention is to provide a process for forming a deposited film, allowing to easy control of the characteristics of the functional film, thus at least maintaining the satisfactory characteristics obtainable with the conventional process, also to improve the film forming speed, to simplify the control of film forming conditions and to achieve mass production of the film.

According to an aspect of the present invention, there is provided a process for forming a deposited film, which comprises introducing, into a film forming space for forming said deposited film on a substrate, compounds A-1 and B-1 respectively represented by following general formulae and employed as raw materials for said deposited film:

$$R_n M^1{}_m \quad (A\text{-}1)$$

$$A^1{}_a B_b \quad (B\text{-}1)$$

and active species capable of causing a chemical reaction with at least one of said compounds, thereby forming a deposited film on said substrate, wherein m is a positive integer equal to the valence of R or a multiple thereof, n is a positive integer equal to the valence of $M^1$ or a multiple thereof, $M^1$ stands for an element of group III of the periodic table, R stands for a hydrogen atom (H), a halogen atom (X) or a hydrocarbon group, a is a positive integer equal to the valence of B or a multiple thereof, b is a positive integer equal to the valence of $A^1$ or a multiple thereof, $A^1$ stands for an element of the group V of the periodic table, and B stands for a hydrogen atom (H), a halogen atom (X) or a hydrocarbon group.

According to another aspect of the present invention, there is provided a process for forming a deposited film, which comprises introducing, intr a film forming space for forming said deposited film on a substrate, compounds A-2 and B-2 respectively represented by following general formulae and employed as raw materials for said deposited film:

$$R_n M^2{}_m \quad (A\text{-}2)$$

$$A^2{}_a B_b \quad (B\text{-}2)$$

and active species capable of causing a chemical reaction with at least one of said compounds, thereby forming a deposited film on said substrate, wherein m is a positive integer equal to the valence of R or a multiple thereof, n is a positive integer equal to the valence of $M^2$ or a multiple thereof, $M^2$ stands for an element of group II of the periodic table, R stands for a hydrogen atom (H), a halogen atom (X) or a hydrocarbon group, a is a positive integer equal to the valence of B or a multiple thereof, b is a positive integer equal to the valence of $A^2$ or a multiple thereof, $A^2$ stands for an element of the group VI of the periodic table, and B stands for a hydrogen atom (H) a halogen atom (X) or a hydrocarbon group.

According to still another aspect of the present invention, there is provided a process for forming a deposited film, which comprises introducing, into a film forming space for forming said deposited film on a substrate, compounds A-1 and B-1 respectively represented by following general formulae and employed as raw materials for said deposited film:

$$R_n M^1_m \quad \text{(A-1)}$$

$$A^1_a B_b \quad \text{(B-1)}$$

and an active halogen capable of causing a chemical reaction with at least one of said compound, thereby forming a deposited film on said substrate, wherein m is a positive integer equal to the valence of R or a multiple thereof, n is a positive integer equal to the valence of $M^1$ or a multiple thereof, $M^1$ stands for an element of the group III of the periodic table, R stands for a hydrogen atom (H), a halogen atom (X) or a hydrocarbon group, a is a positive integer equal to the valence of B or a multiple thereof, b is a positive integer equal to the valence of $A^1$ or a multiple thereof, $A^1$ stands for an element of group V of the periodic table, and B stands for a hydrogen atom (H), a halogen atom (X) or a hydrocarbon group.

According to still another aspect of the present invention, there is provided a process for forming a deposited film, which comprises introducing, into a film forming space for forming said deposited film on a substrate, compounds A-2 and B-2 respectively represented by following general formulae and employed as raw materials for said deposited film $$R_n M^2_m \quad \text{(A-2)}$$

$$A^2_a B_b \quad \text{(B-2)}$$

and an active halogen capable of causing a chemical reaction with at least one of said compounds, thereby forming a deposited film on said substrate, wherein m is a positive integer equal to the valence of R or a multiple thereof, n is a positive integer equal to the valence of $M^2$ or a multiple thereof, $M^2$ stands for an element of group II of the periodic table, R stands for a hydrogen atom (H), a halogen atom (X) or a hydrocarbon group, a is a positive integer equal to the valence of B or a multiple thereof, b is a positive integer equal to the valence of $A^2$ or a multiple thereof, $A^2$ stands for an element of group VI the periodic table, and B stands for a hydrogen atom (H), a halogen atom (X) or a hydrocarbon group.

BRIEF DESCRIPTION OF THE DRAWING

FIG. 1 is a schematic view of an apparatus for executing the process of the present invention.

DETAILED DESCRIPTION OF THE PREFERRED EMBODIMENTS

In the process of the present invention, the formation of a deposited film of a desired function is governed, as the controlling parameters, by the amounts of the compounds A-1 or A-2 and B-1 or B-2 represented by the aforementioned general formulas A-1 or A-2 and B 1 or B-2 and of the active species capable of chemically reacting with at least one of said compounds, the temperatures of the substrate and of the film forming space, and the pressure in said space, and can therefore be easily controlled and conducted on a large scale with sufficient reproducibility.

The active species employed in the present invention have a function of causing a chemical interaction with said compound A-1 or A-2 and/or compound B-1 or B-2 to supply an energy thereto, or chemically reacting with said compound A-1 or A-2 and/or compound B-1 or B-2, thereby rendering said compound(s) A-1 or A-2 and/or B-1 or B-2 capable of forming a deposited film Consequently said active species may or may not contain components which will become constituents of the deposited film to be formed.

The compounds A-1, A-2, B-1 and B-2 respectively represented by the aforementioned general formulae A-1, A-2, B-1 and B-2 and to be employed in the present invention are preferably those capable of causing a chemical reaction with said active species through molecular collisions therewith, theeby spontaneously generating chemical species contributing to the formation of the deposited film on the substrate. However, if such compounds lack enough activity or are not reactive with the aforementioned active species in the normal state, it becomes necessary to provide the compounds A-1, A-2 and B-1, B-2 with an excitation energy, at the film formation or prior thereto, to an extent not inducing complete dissociation of $M^1$, $M^2$ and $A^1$, $A^2$ in the foregoing general formulae A-1, A-2 and B-1, B-2 to shift said compounds to an excited state capable of chemically reacting with the active species, and such excitable compound is employed as one of the compound A-1 or A-2 and the compound B-1 or B-2.

In the present invention, said compounds in such excited state will be referred to as excited species.

Examples of the compounds that can be effectively employed in the present invention as the compounds A-1 and B-1, respectively represented by the general formulae $R_n M^1_m$ (A-1) and $A^1_a B_b$ (B-2) will be explained in the following.

In said compounds A-1 and B-1, $M^1$ is an element of group III of the periodic table, particularly of group IIIB, i.e. B, Al, Ga, In or Tl, while $A^1$ is an element of group V of the periodic table, particularly of group VB, i.e. N, P, As, Sb or Bi.

Also examples of the compounds that can be effectively employed in the present invention as the compounds A-2 and B-2, respectively represented by the general formulae $R_n M^2_m$ (A-2) and $A^2_a B_b$ (B-2) will be explained in the following.

In said compounds A-2 and B-2, $M^2$ is an element of group II of the periodic table, particularly of group IIB, i.e. Zn, Cd or Hg, while A2 is an element of group VI of the periodic table, particularly of group VIB, i.e. 0, S, Se or Te.

In the foregoing formulae, examples of R and B are mono-, di- and tri-valent hydrocarbon groups derived from linear and branched, saturated and unsaturated hydrocarbons, and mono-, di- and trivalent hydrocarbon groups derived from saturated and unsaturated, monocyclic and polycyclic hydrocarbons.

Among such unsaturated hydrocarbon groups, there may be effectively employed not only those containing only one kind of carbon-carbon bonds but also those containing at least two of single, double and triple carbon-carbon bonds, as long as they meet the purpose of the present invention.

Also in the unsaturated hydrocarbon radicals containing plural double bonds, said double bonds may be mutually connected or separated.

Preferred examples of the acyclic hydrocarbon groups are alkyl, alkenyl, alkvnyl, alkylidene, alkenylidene, alkynylidene, alkylidine, alkenylidine, alkynylidine, and the like, and the number of carbon atoms in such group is preferably in a range from 1 to 10, more preferably from 1 to 7, and most preferably from 1 to 5.

In the present invention, the combinations of R and $M^1$ or $M^2$, and of $A^1$ or $A^2$ and B are so selected, in the above-explained ranges, that the compound A-1, A-2 and B-1, B-2 are gaseous in the normal condition or are easily gasifiable under the condition of use.

Examples of the compound A-1 effectively employable in the present invention include $BMe_3$, $Al_2Me_6$, $GaMe_3$, $InMe_3$, $TlMe_3$, $BEt_3$, $Al_2Et_6$, $GaEt_3$. $InEt_3$, $TlEt_3$, $BX_3$, $B_2H_6$, and $Ga_2H_6$, while examples of the compound B-1 effectively employable include $Me_3N$, $Me_3P$, $Me_3As$, $Me_3Sb$, $Me_3Bi$, $Et_3N$, $Et_3P$, $Et_3As$, $Et_3Sb$, $Et_3Bi$, $NX_3$, $PX_3$, $AsX_3$, $NH_3$, $PH_3$. $AsH_3$ and $SbH_3$.

Examples of the compound A-2 effectively employable in the present invention include $ZnMe_2$, $CdMe_2$, $ZnEt_2$ and $CdEt_2$, while examples of the compound B-2 effectively employable include $Me_{2O}$, $Me_2S$, $Me_2Se$, $Me_2Te$ $Et_{2O}$, $Et_2S$, $Et_2Se$, $Et_2Te$, $X_{2O}$, $SX_2$, $SX_4$, $SX_6$, $SeX_2$, $SeX_4$, $SeX_6$, $TeX_6$, $H_2O$, $H_2S$, $H_2Se$ and $H_2Te$.

In the foregoing X stands for a halogen atom (F, Cl, Br or I), Me a methyl group and Et an ethyl group.

The life of the active species to be employed in the present invention should preferably be shorter in consideration of the reactivity with the compound A and/or B, but longer in consideration of the ease of handling at film formation and of transportation to the film forming space. Said life also depends on the pressure in said film forming space.

Consequently active species of an appropriate life are suitably selected in relation to other film forming conditions so as to achieve effective preparation, including production efficiency, of a functional film of desired characteristics.

The active species to be employed in the present invention are suitably selected, among those of appropriate life selected as explained above, ir consideration of the chemical affinity with the compound A-1 or A-2 and/or the compound B-1 or B-2, and in the preferred conditions of the present invention, said life is preferably $1 \times 10^{-4}$ sec. or longer, more preferably $1 \times 10^{-3}$ sec. or longer, and most preferably $1 \times 10^{-2}$ sec. or longer.

In case the active species employed in the present invention induces a chemical chain reaction with the compound A-1 or A-2 and/or the compound B-1 or B-2, said active species at least functions as a so-called initiator so that the amount thereof introduced into the film forming space may be limited to an amount ensuring effective continuance of said chain reaction.

The active species employed in the present invention are introduced into the film forming space (A) at the formation of a deposited film therein, and undergo chemical interaction with the compound A-1 or A-2 and B-1 or B-2, containing components which will become constituents of the deposited film to be formed, and/or active species of said compound A-1 or A-2 and/or active species of said compound B-1 or B-2. Consequently there is easily formed, on a desired substrate, a deposited film with desired functions, composed of a compound of groups III-V or II-VI.

Thus the present invention can provide a stabler CVD process through the control of the temperatures of the atmosphere in the film forming space (A) and of the substrate.

One of the points of the process of the present invention different from the conventional CVD process is the use of active species which are activated, in advance, in an activation space (C) different from the film forming space (A), and this fact not only enables significant improvement in the deposition speed in comparison with the conventional CVD process but also allows use of a lower substrate temperature at the film formation, thus providing a deposited film of stable quality and well-controlled characteristics on a large commercial scale and with a reduced cost.

In the present invention, the active species may be generated in the activation space (C) not only by energies such as electric discharge, light, heat or combinations thereof but also by the contact with or addition of a catalyst.

In the present invention, the material for generating said active species in the activation space (C) is preferablyaa gaseous or easily gasifiable substance capable of generating hydrogen radicals, such as $H_2$, $D_2$ or HD, or rare gas such as He or Ar.

Otherwise the material for generating said active species in the activation space (C) is preferably a gaseous or easily gasifiable substance capable of generating halogen radicals, for example a halogen gas such as $F_2$, $Cl_2$, $Br_2$ or $I_2$, or an interhalogen compound such as BrF, ClF, $ClF_3$, $ClF_5$, $BrF_5$, $BrF_3$, $IF_7$, $IF_5$, ICl or IBr, eventually mixed with a rare gas such as He or Ar.

Such substance is subjected, in the activation space (C), to activation energy such as heat, light or electric discharge, to generate the active species, which are then introduced into the film forming space (A). The life of said active species is preferably equal to $1 \times 10^{-4}$ sec. or longer, and such life improves the efficiency and speed of deposition and increases the efficiency of chemical reaction with the compound A-1 or A-2 introduced into the film forming space (A).

Examples of the activation energy, for activating the aforementioned substance in the activation space (C), are thermal energy such as heat from a resistor or infrared light, optical energy such as light from a laser, a mercury lamp or a halogen lamp, electric energy such as a discharge of microwave, high frequency, low frequency or direct current etc., which may be applied in the activation space (C) to said substance singly or in combination. The compound A-1 or A-2, compound B-1 or B-2 and active species, to be introduced into the film forming space (A), can be respectively so selected, as explained before, as to induce a chemical reaction by mutual collisions in the molecular level, thereby forming a functional film on a desired substrate. However, in case the compound A-1 or A-2, compound B-1 or B-2 and active species thus selected do not have enough chemical reactivity, or in case of improving the efficiency of chemical reaction to achieve effective film formation on the substrate, there may be applied, in the film forming space (A), a reaction stimulating energy acting on the compound A-1 or A-2, compound B-1 or B-2 and/or active species, for example the same as the activation energy employed in said activation space (C). Also there may be applied, in a separate activation space (B), an excitation energy to the compound A-1 or A-2 and compound B-1 or B-2 prior to the introduction thereof into the film forming space (A), in order to bring said compounds to the aforementioned excited state.

In the present invention, the ratio of the total amount of the compounds A-1 or A-2 and B-1 or B-2 introduced into the film forming space (A) to the amount of the active species introduced from the activation space (C) is suitably determined, according to the nature of said compounds A-1, A-2, B-1, B-2 and of the active species, film forming conditions, desired characteristics of the deposited film etc., but is preferably in a range from 1000 1 to 1 10 in the ratio of flow rates, and more preferably from 500 1 to 1 : 5.

In case the active species do not cause a chemical chain reaction with the compound A-1 or A-2 and/or compound B-1 or B-2, the above-mentioned ratio is preferably selected in a range from 10 1 to 1 : 10, more preferably from 4 1 to 2 : 3. The pressure in the film forming space (A) at the film formation is suitably determined according to the nature of the compounds A-1, A-2, B-1, and B-2 and of the active species, and the film forming conditions, but is preferably selected in a range from $1 \times 10^{-2}$ to $5 \times 10^3$ Pa, more preferably from $5 \times 10^{-2}$ to $1 \times 10^3$ Pa, and most preferably $1 \times 10^{-1}$ to $5 \times 10^2$ Pa. In case the substrate has to be heated at the film formation, the temperature thereof is preferably in a range from 50 to 1000 °C, more preferably from 100 to 900 °C, and more preferably from 100 to 750 °C.

The compound A-1 or A-2, compound B-1 or B-2 and active species can be introduced into the film forming space (A) either through transport pipes connected thereto or through transport pipes which are extended to the vicinity of the film forming surface of a substrate placed in the film forming space (A) and have nozzle-shaped ends. It is also possible to employ double transport pipes of which the inner pipe is used for transporting either, for example the active species, while the outer pipe is used for transporting the other, for example the compounds A-1 or A-2 and B-1 or B-2, into the film forming space (A).

It is furthermore possible to employ three nozzles connected to the transport pipes and arranged close to the surface of a substrate placed in the film forming space (A), thereby mixing said compounds A-1 or A-2 and B-1 or B-2 and the active species in the vicinity of the said surface as they are emitted from said nozzles. This arrangement is preferred for a pattern preparation simultaneous with film formation, since a functional film can be selectively formed on the substrate.

The film forming process of the present invention allows improvement in the electrical, optical, photoconductive and mechanical properties of the deposited film, improvement in the reproducibility in the film formation, attainment of improved film quality and uniformity and obtainment of a film of a large area, thus enabling improve productivity and achievement of mass production of the film.

Furthermore, said process allows the use of a substrate not resistant to heat and can reduce the process temperature because the film formation at a low temperature is possible, and said process can control the composition and characteristics of the deposited layer to be formed through the control of the amounts of the active species.

Now the present invention will be further clarified by the following examples.

EXAMPLE 1

200 sccm of $H_2$ gas was introduced, from a gas introduction pipe 102-1 shown in FIG. 1, into an activation chamber 103 composed of a quartz glass pipe, to which a microwave of 280 W was applied from a wave guide functioning as an activation source 105 placed on the activation chamber 103, thereby generating H radicals therein. The generated H radicals were introduced, through a transport pipe 102-2 composed of a quartz glass pipe and a nozzle 100-3, into a film forming chamber 104 which was maintained at 8 Pa through a valve 110 by an evacuation pump 111.

Simultaneously $(CH_3)_2Ga$, bubbled with He gas, was introduced at a rate of 10 mmo l/min into the film forming chamber 104 through a gas introduction pipe 101-2 and a nozzle 100-2. On the other hand, $AsH_3$ gas was introduced into the film forming chamber 104 at a rate of 10 mmol/min through a gas introduction pipe 101-1 and a nozzle 100-1. $(CH_3)_2Ga$ and $AsH_3$ were activated by the H radicals to liberate Ga and As, thus forming a GaAs film of a thickness of about 1.2 μm in 1.5 hours, over an area of 30×30 cm on a quartz substrate 108 placed on a substrate setting means 107 and heated to about 300° C. with a substrate heater 109.

In the evaluation of characteristics, said GaAs film proved to be free from fluctuation in the thickness, and almost free from locality in the semiconductor characteristics.

EXAMPLE 2

Films shown in Table 1A were prepared by repeating the process of the Example 1, except that $(CH_3)_2Ga$ and $AsH_3$ were replaced by the compounds A-1 and B-1 listed in Table 1A, the amounts of the compounds A-1 and B-1 were each changed to 1 mmol/min, and except for the conditions noted therein.

In the evaluation of characteristics, these films proved to be uniform in thickness, and to have uniform and satisfactory characteristics.

TABLE 1A

| Sample No. | Compound A-1 / Compound B-1 | Deposited film | Thickness (μm) | Substrate temp. (°C.) | Film characteristics |
|---|---|---|---|---|---|
| 1 | $(CH_3)_3Ga$ / $PH_3/AsH_3$ | GaAsP | 1.1 | 300 | Good |
| 2 | $(CH_3)_3Al$ / $SbH_3$ | AlSb | 1.1 | 350 | Good |
| 3 | $(C_2H_5)_3In$ / $PH_3$ | InP | 1.5 | 280 | Good |
| 4 | $(CH_3)_3In$ / $AsH_3$ | InAs | 0.8 | 300 | Good |
| 5 | $(CH_3)_3Ga$ / $SbH_3$ | GaSb | 1.0 | 320 | Good |
| 6 | $(C_2H_5)_3In$ / $SbH_3$ | InSb | 1.5 | 350 | Good |
| 7 | $Ga_2H_6$ / $(CH_3)_3Sb$ | GaSb | 1.0 | 290 | Good |
| 8 | $(CH_3)_3Ga/(CH_3)_3Al$ / $AsH_3$ | GaAlAs | 0.9 | 350 | Good |

EXAMPLE 3

In the process shown in Example 1, a high-frequency power of 3 W (13.56 MHZ) was injected by a RF discharge device 106 provided around the film forming chamber 104 to generate plasma atmosphere therein. A substrate 108 was placed at about 1 cm downstream of the plasma atmosphere in order to avoid direct contact therewith. A GaAs film of a thickness of about 2 μm was formed after 1 hour from the start of film formation. The substrate was maintained at 280° C. Other conditions were the same as in Example 1.

In an evaluation the same as in Example 1, said GaAs film proved to be of good quality.

Said film was also mechanically satisfactory, without any peeling from the substrate.

EXAMPLE 4

200 sccm of $H_2$ gas was introduced, from a gas introduction pipe 102-1 shown in FIG. 1, into an activation chamber 103 composed of a quartz glass pipe, to which a microwave of 280 W was applied from a wave guide, placed as an activation source 105 on the activation chamber 103, thereby generating H radicals therein. The generated H radicals were introduced, through a transport pipe 102-2 composed of a quartz glass pipe and a nozzle 100-3, into a film forming chamber 104 which was maintained at 8 Pa through a valve 110 by an evacuation pump 111.

Simultaneously $(C_2H_5)_2Zn$, bubbled with He gas, was introduced at a rate of 10 mmol/min into the film forming chamber 104 through a gas introduction pipe 101-2 and a nozzle 100-2. On the other hand, $H_2S$ gas was introduced into the film forming chamber 104 at a rate of 10 mmol/min through a gas introduction pipe 101-1 and a nozzle 100-1. $(C_2H_5)_2Zn$ and $H_2S$ were activated by the H radicals to liberate Zn and S, thus forming a ZnS film of a thickness of about 2.2 μm in 1.5 hours, over an area of 30×30 cm on an $Al_2O_3$ substrate 108 placed on a substrate setting means 107 and heated to about 220° C with a substrate heater 109.

In the evaluation of characteristics, said ZnS film proved to be free from fluctuation in the thickness, and almost free from locality in the semiconductor characteristics.

EXAMPLE 5

Films shown in Table 1B were prepared by repeating the process of the Example 4, except that $(C_2H_5)_2Zn$ and $H_2S$ in the Example 4 were replaced by the compounds A-2 and B-2 listed in Table 1B the amounts of the compounds A-2 and B-2 were each changed to 1 mmol/min, and except for the conditions noted therein.

In the evaluation of characteristics, these films proved to be uniform in thickness and to have uniform and satisfactory characteristics.

TABLE 1B

| Sample No. | Compound A-2 / Compound B-2 | Deposited film | Thickness (μm) | Substrate temp. (°C.) | Film characteristics |
|---|---|---|---|---|---|
| 1 | $(C_2H_5)_2Zn$ / $H_2Se$ | ZnSe | 2.0 | 250 | Good |
| 2 | $(C_2H_5)_2Zn$ / $(CH_3)_2Te$ | ZnTe | 1.8 | 240 | Good |
| 3 | $(CH_3)_2Cd$ / $H_2S$ | CdS | 1.5 | 280 | Good |
| 4 | $(CH_3)_2Cd$ / $H_2Se$ | CdSe | 1.5 | 250 | Good |
| 5 | $(CH_3)_3Cd$ / $(CH_3)_2Te$ | CdTe | 2.1 | 220 | Good |

EXAMPLE 6

In the process shown in Example 4, a high-frequency power of 3 W (13.56 MHz) was injected by a RF discharge device 106 provided around the film forming chamber 104 to generate plasma atmosphere therein. A substrate 108 was placed at about 1 cm downstrem of the plasma atmosphere in order to avoid direct contact therewith. A ZnS film of a thickness of about 2.5 μm was formed after 1 hour from the start of film formation. The substrate was maintained at 200° C. Other conditions were the same as in the Example 4.

In an evaluation the same as in Example 4, said ZnS film proved to be of good quality.

Said film was also mechanically satisfactory. without any peeling from the substrate.

EXAMPLE 7

200 sccm of $F_2$ gas was introduced, from a gas introduction pipe 102-1 shown in FIG. 1, into an activation chamber 103 composed of a quartz glass pipe, to which a microwave of 300 W was applied from a wave guide, placed as an activation source 105 on the activation chamber 103, thereby generating F radicals therein. The generated F radicals were introduced, through a transport pipe 102-2 composed of a quartz glass pipe and a nozzle 100-3, into a film forming chamber 104 which was maintained at 8 Pa through a valve 110 by an evacuation pump 111.

Simultaneously $(CH_3)_2Ga$, bubbled with He gas, was introduced at a rate of 10 mmol/min into the film forming chamber 104 through a gas introduction pipe 101-2 and a nozzle 100-2. On the other hand, $AsH_3$ gas was introduced into the film forming chamber 104 at a rate of 10 mmol/min through a gas introduction pipe 101-1 and a nozzle 100-1. $(CH_3)_2Ga$ and $AsH_3$ were activated by the F radicals to liberate Ga and As, thus forming a GaAs film of a thickness of about 1.2 μm in 1.5 hours, over an area of 30×30 cm on a quartz substrate 108 placed on a substrate setting means and heated to about 320° C with a substrate heater 109.

In the evaluation of characteristics, said GaAs film proved to be free from fluctuation in the thickness, and almost free from locality in the semiconductor characteristics.

EXAMPLE 8

Films shown in Table 1C were prepared by repeating the process of Example 7, except that $(CH_3)_2Ga$ and $AsH_3$ in Example 7 were replaced by the compounds A-1 and B-1 listed in Table 1C, the amounts of the compounds A-1 and B-1 were each changed to 1 mmol/min, and except for the conditions noted therein.

In the evaluation of characteristics, these films proved to be uniform in thickness and to have uniform and satisfactory characteristics.

TABLE 1C

| Sample No. | Compound A-1 / Compound B-1 | Deposited film | Thickness (μm) | Substrate temp. (°C.) | Film characteristics |
|---|---|---|---|---|---|
| 1 | $(CH_3)_3Ga$ / $PH_3/AsH_3$ | GaAsP | 1.0 | 350 | Good |
| 2 | $(CH_3)_3Al$ / $SbH_3$ | AlSb | 1.2 | 370 | Good |
| 3 | $(C_2H_5)_3In$ / $PH_3$ | InP | 1.4 | 300 | Good |
| 4 | $(CH_3)_3In$ / $AsH_3$ | InAs | 1.0 | 330 | Good |
| 5 | $(CH_3)_3Ga$ / $SbH_3$ | GaSb | 0.8 | 350 | Good |
| 6 | $(C_2H_5)_3In$ / $SbH_3$ | InSb | 1.3 | 390 | Good |
| 7 | $Ga_2H_6$ / $(CH_3)_3Sb$ | GaSb | 1.1 | 310 | Good |
| 8 | $(CH_3)_3Ga/(CH_3)_3Al$ / $AsH_3$ | GaAlAs | 1.0 | 380 | Good |

EXAMPLE 9

In the process shown in Example 7, a high-frequency power of 3 W (13.56 MHz) was injected by a RF discharge device 106 provided around the film forming chamber 104 to generate plasma atmosphere therein. A substrate 108 was placed at about 1 cm downstream of the plasma atmosphere in order to avoid direct contact therewith. A GaAs film of a thickness of about 2 μm was formed after 1 hour from the start of film formation. The substrate was maintained at 300° C. Other conditions were the same as in Example 7.

In an evaluation same as in the Example 7, said GaAs film proved to be of good quality.

Said film was also mechanically satisfactory, without any peeling from the substrate.

EXAMPLE 10

A GaAs film was prepared by repeating the process of the Exmaple 7, except that $F_2$ gas was replaced by $Cl_2$ gas Said GaAs film also proved tc have satisfactory characteristics.

EXAMPLE 11

200 sccm of $F_2$ gas was introduced, from a gas introduction pipe 102-1 shown in FIG. 1, into an activation chamber 103 composed of a quartz glass pipe, to which a microwave of 300 W was applied from a wave guide, placed as an activation source 105 on the activation chamber 103, thereby generating F radicals therein. The generated F radicals were introduced, through a transport pipe 102-2 composed of a quartz glass pipe and a nozzle 100-3, into a film forming chamber 104 which was maintained at 8 Pa through a valve 110 by an evacuation pump 111.

Simultaneously $(CH_3)_2Zn$, bubbled with He gas, was introduced at a rate of 10 mmol/min into the film forming chamber 104 through a gas introduction pipe 101-2 and a nozzle 100-2. On the other hand, $H_2S$ gas was introduced into the film forming chamber 104 at a rate of 10 mmol/min through a gas introduction pipe 101-1 and a nozzle 100-1. $(C_2H_5)_2Zn$ and $H_2S$ were activated by the F radicals to liberate Zn and S, thus forming a ZnS film of a thickness of about 2.2 μm in 1.5 hours, over an area of 30×30 cm on an $Al_2O_3$ substrate 108 placed on a substrate setting means 107 and heated to about 230° C. with a substrate heater 109.

In the evaluation of characteristics, said ZnS film proved to be free from fluctuation in the thickness, and almost free from locality in the semiconductor characteristics.

EXAMPLE 12

Films shown in Table lD were prepared by repeating the process of Example 11, except that $(C_2H_5)_2Zn$ in Example 11 were replaced by the compounds A-2 and B-2 listed in Table lD the amounts of the compounds A-2 and B-2 were each changed to l mmol/min, and excelt for the conditions noted therein.

In the evaluation of characteristics, thes films proved to be uniform in thickness and to have uniform and satisfactor characteristics.

TABLE 1D

| Sample No. | Compound A-2 / Compound B-2 | Deposited film | Thickness (μm) | Substrate temp. (°C.) | Film characteristics |
|---|---|---|---|---|---|
| 1 | $(C_2H_5)_2Zn$ / $H_2Se$ | ZnSe | 2.1 | 290 | Good |
| 2 | $(C_2H_5)_2Zn$ / $(CH_3)_2Te$ | ZnTe | 1.7 | 280 | Good |
| 3 | $(CH_3)_2Cd$ / $H_2S$ | CdS | 1.4 | 300 | Good |
| 4 | $(CH_3)_2Cd$ / $H_2Se$ | CdSe | 1.6 | 280 | Good |
| 5 | $(CH_3)_3Cd$ / $(CH_3)_2Te$ | CdTe | 2.0 | 270 | Good |

EXAMPLE 13

In the process shown in Example 11, a high-frequency power of 3 W (13.56 MHz) was injected by a RF discharge device 106 provided around the film forming chamber 104 to generate plasma atmosphere therein. A substrate 108 was placed at about 1 cm downstream of the plasma atmosphere in order to avoid direct contact therewith. A ZnS film of a thickness of about 2 μm was formed after 1 hour from the start of film formation. The substrate was maintained at 200° C. Other conditions were the same as in Example 11.

In an evaluation the same as in Example 11, said ZnS film proved to be of good quality.

Said film was also mechanically satisfactory, without any peeling from the substrate.

EXAMPLE 14

A ZnS film was prepared by repeating the process of Example 11, except that $F_2$ gas was replaced by $Cl_2$ gas. Said ZnS film also proved to have satisfactory characteristics.

What is claimed is:

1. A process for forming a deposited film on a substrate in a film forming space, comprising
generating in a activation space an active species capable of effecting a chemical reaction with at least one of a compound (A-1) or a compound (B-1); said active species being generated from at least one selected from the group consisting of $H_2$, $D_2$, HD and mixtures thereof;

introducing said compound (A-1), said compound (B-1) and said active species into the film forming space; said film forming spaced being different from said activation spaced; and allowing said active species to react with at least one of said compound (A-1) or said compound (B 1) to thereby form a deposited film on the substrate; said compound (A-1) and compound (B-1) being starting materials for forming the deposited film wherein compound (A-1) has the formula $R_nM^1{}_m$ and compound (B-1) has the formula $A^1{}_aB_b$, wherein m is a positve integer which is equal to or is a multiple of the valence of R, n is a positive integer which is equal to or is a multiple of the valence of $M^1$, $M^1$ is an element of Group III of the periodic table, R is hydrogen, a halogen or a hydrocarbon group, a is a positive integer which is equal to or is a multiple of the valence of B, b is a positive integer which is equal to or is a multiple of hte valence of $A^1$, $A^1$ is an element of Group v of the periodic table, and B is hydrogen, a halogen or a hydrocarbon group.

2. A process according to claim 1, wherein $M^1$ is selected from the group consisting of B, Al, Ga, In and Tl.

3. A process according to claim 1, wherein $A^1$ is selected from the group consisting of N, P, As, Sb and Bi.

4. A process for forming a deposited film on a substrate in a film forming space, comprising generating in an activation space an active species capable of effecting a chemical reaction with at least one of a compound (A-1) or a compound (B-1); said active species being generated from at least one selected from the group consisting of $H_2$, $D_2$, HD and mixtures thereof; · introducing said compound (a 2), said compound (B-2) and said active species into the film forming space; said film forming space being different from said activation space; and allowing said activespecies to react with at least one of said compound (A-2) or said compound (B-2) to thereby form a deposited film on the substrate; said compound (A-2) and compound (B-2) being starting materials for forming the deposited film wherein compound (A-2) has the formula $R_nM^2m$ and compound (B-2) has the formula $A^2{}_aB_b$, wherein m is a positive integer which is equal to or is a multiple of the valence of R, n is a positive integer which is equal to or is a multiple of the valence of $M^2$, $M^2$ is an element of Group II of the periodic table, R is hydrogen, a halogen or a hydrocarbon group, a is a positive integer which is equal to or is a multiple of the valence of B, b is a positive integer which is equal to or is a multiple of the valence of $A^2$, $A^2$ is an element of Group vI of the periodic table, and B is hydrogen, a halogen or a hydrocarbon group.

5. A process according to claim 4, wherein $M^2$ is selected from the group consisting of O, S, Se and Te.

6. A process according to claim 4, wherein $A^2$ is selected from the group consisting of O, S, Se and Te.

7. A process for forming a deposited film on a substrate in a film forming space, comprising generating in an activation space an active halogen capable of effecting a chemical reaction with at least one of a compound (A-1) or a compound (B-1); said active halogen being generated from at least one selected from the group consisting of $F_2$, $Cl_2$, $Br_2$, $I_2$, BrF, ClF, $ClF_3$, $ClF_5$, $BrF_5$, $BrF_3$, $IF_7$, $IF_5$, ICl, IBr, and mixtures thereof;

introducing said compound (A-1), said compound (B-1) and said active halogen into the film forming space; said film forming space being different from said activation space; and allowing said actie halogen to react with at least one of said compound (A-1) or said compound (B-1) to thereby form a deposited film on the substraste; said compount (A-1) and compound (B-1) being starting materials for forming the depostied film wherein compound (A-1) has the formula $R_nM^1{}_m$ and compounds (B-1) hast he formula $AlaBb$, wherein m is a positive integer which is equal to or is a multiple of the valence of R, n is a positive integer which is equal to or is a multiple of the valence of $M^1$, $M^1$ is an element of Group III of the periodic table, R is hydrogen, a halogen or a hydrocarbon group, a is a positive integer which is equal to or is a multiple of the valence of B, b is a positive integer which is equal to or is a multiple of the valence of $A^1$, $A^1$ is an element of Group V of the periodic table, and B is hydrogen, a halogen or a hydrocarbon group.

8. A process according to claim 7, wherein $M^1$ is selected from the group consisting of B, Al, Ga, In and Tl.

9. A process according to claim 7, wherein $A^1$ is selected from the group consisting of N, P, As, Sb and Bi.

10. A process for forming a depostied film on a substrate in a film forming space, comprising generating in an activation space an active halogen capable of effecting a chemical reaction with at least one of a compound (A-I) or a compound (B-1); said active halogen being generated from at least one selected from the group consisting of $F_2$, C12, $Br_2$, $I_2$, BrF, ClF, $ClF_3$, $ClF_5$, $BrF_5$, $BrF_3$, $IF_7$, $IF_5$, ICl, IBr, and mixtures thereof;

introducing said compound (A-2), said compound (B 2) and said active halogen into the film forming space; said film forming space being different from said activation space; and allowing said active halogen to react witgh at least one of said compound (A-2) or said compound (B-2) to thereby form a deposited film on the substrate; said compound (A-2) and compound (B-2) being starting materials for fomring the deposited film wherein compound (A-2) has the formula $R_nM^2m$ and compound (B-2) has the formula $A2aBb$, wherein m is a positive integer which is equal to or is a multiple of the valence of R, n is a positive integer which is equal to or is a multiple of the valence of $M_2$, $M^2$ is an element of Group II of the periodic table, r is hydrogen, a halogen or a hydrocarbon group, a is a positive integer which is equal to or is a multiple of the valence of B, b is a positive integer which is equal to or is a multiple of the valence of $A2$ is an element of Group vI of the periodic talbe, and B is hydrogen, a halogen or a hydrocarbon group.

11. A process according to claim 10, wherein $M^2$ is selected from group consisting of Zn, Cd and Hg.

12. A process according to claim 10, wherein $A^2$ is selected from group consisting of O, S, Se and Te.

* * * * *

UNITED STATES PATENT AND TRADEMARK OFFICE
CERTIFICATE OF CORRECTION

PATENT NO. : 4,772,486
DATED : September 20, 1988
INVENTOR(S) : SHUNICHI ISHIHARA, ET AL.    Page 1 of 4

It is certified that error appears in the above-identified patent and that said Letters Patent is hereby corrected as shown below:

COLUMN 1

Line 2, "abandoned" should read --abandoned.--.
    Line 25, "a" should be deleted.
    Line 27, "resistance" should read --resistance to--.

COLUMN 2

Line 9, "to" should be deleted.
    Line 44, "intr" should read --into--.

COLUMN 3

Line 30, "film" should read --film:--.
    Line 60, "B 1" should read --B-1--.

COLUMN 4

Line 5, "film" should read --film.--.
    Line 14, "theeby" should read --thereby--.
    Line 48, "A2" should read --$A^2$--.
    Line 49, "0" should read --O--.
    Line 67, "alkvnyl" should read --alkynyl--.

COLUMN 5

Line 12, "GaEt3" should read --$GaEt_3$--.
    Line 16, "$PH_3$." should read --$PH_3$,--.
    Line 21, "$Me_{20}$" should read --$Me_2O$--.

Line 40, "ir" should read --in--.

UNITED STATES PATENT AND TRADEMARK OFFICE
CERTIFICATE OF CORRECTION

PATENT NO. : 4,772,486
DATED : September 20, 1988
INVENTOR(S) : SHUNICHI ISHIHARA, ET AL.

It is certified that error appears in the above-identified patent and that said Letters Patent is hereby corrected as shown below:

COLUMN 6

Line 19, "blyaa" should read --bly a--.

COLUMN 7

Line 7, "1000 1 to 1 10" should read --1000:1 to 1:10--.
   Line 8, "500 1 to 1 : 5" should read --500:1 to 1:5--.
   Line 12, "10 1 to 1 : 10" should read --10:1 to 1:10--.
   Line 13, "4 1 to 2 : 3" should read --4:1 to 2:3--.
   Line 48, "in" should read --of--.
   Line 51, "improve" should read --improved--.

COLUMN 9

Line 44, "the" (second occurrence) should be deleted.

COLUMN 10

TABLE 1B-continued, "$(CH_3)_3Cd$" should read --$(CH_3)_2Cd$--.

COLUMN 11

Line 48, "gas" should read --gas.--.

COLUMN 12

Line 14, "$(C_2H_5)_2Zn$" should read --$(C_2H_5)_2Zn$ and $H_2S$--.
   Line 17, "I mmol/min," should read --1 mmol/min,--.

UNITED STATES PATENT AND TRADEMARK OFFICE
CERTIFICATE OF CORRECTION

PATENT NO. : 4,772,486

DATED : September 20, 1988

INVENTOR(S) : SHUNICHI ISHIHARA, ET AL.     Page 3 of 4

It is certified that error appears in the above-identified patent and that said Letters Patent is hereby corrected as shown below:

COLUMN 12

Line 18, "excelt" should read --except--.
    Line 19, "thes" should read --these--.
    Line 21, "satisfactor" should read --satisfactory--.
    TABLE 1D, "$(CH_3)_3Cd$" should read --$(CH_3)_2Cd$--.
    Line 67, "a" should read --an--.

COLUMN 13

Line 7, "spaced" should read --space--.
    Line 8, "spaced" should read --space--.
    Line 10, "compound (B 1)" should read --compound (B-1)--.
    Line 23, "hte" should read --the-- and "Group v" should read --Group V--.
    Line 40, "compound (a 2)," should read --compound (A-2)--.
    Line 43, "activespecies" should read --active species--.
    Line 58, "Group vI" should read --Group VI--.
    Line 62, "O, S, Se and Te" should read --Zn, Cd and Hg--.

COLUMN 14

Line 2, "haIogen" should read --halogen--.
    Line 4, "CIF, $CIF_3$," should read --ClF, $ClF_3$,--.
    Line 5, "ICI" should read --ICl--.
    Line 10, "actie halogen" should read --active halogen--.
    Line 12, "substraste" should read --substrate--.
    Line 13, "compount (A-1) should read --compound (A-1)--.
    Line 14, "depostied" shoudl read --deposited--.
    Line 16, "compounds (B-1) hast he formula AlaBb" should read --compound (B-1) has the formula $A^1_a B_b$--.

UNITED STATES PATENT AND TRADEMARK OFFICE
CERTIFICATE OF CORRECTION

PATENT NO. : 4,772,486
DATED : September 20, 1988
INVENTOR(S) : SHUNICHI ISHIHARA, ET AL.

It is certified that error appears in the above-identified patent and that said Letters Patent is hereby corrected as shown below:

COLUMN 14

Line 33, "depostied" should read --deposited--.
Line 37, "compound (A-I)" should read --compound (A-1)--.
Line 40, "CIF$_3$, CIF$_5$," should read --ClF$_3$, ClF$_5$,--.
Line 41, "ICI" should read --ICl--.
Line 42, "compound (B" should read --compound (B- --.
Line 46, "witgh" should read --with--.
Line 50, "fomring" should read --forming--.
Line 52, "R$_n$M$^2$m" should read --R$_n$M$^2_m$--.
Line 53, "A2aBb," should read --A$^2_a$B$_b$,--.
Line 56, "M$_2$" should read --M$^2$--.
Line 57, "r" should read --R--.
Line 61, "A2" should read --A$^2$, A$^2$-- and "Group vI" should read --GROUP VI--.
Line 62, "talbe," should read --table,--.
Line 65, "from group" should read --from the group--.
Line 67, "from group" should read --from the group--.

Signed and Sealed this

Twenty-seventh Day of October, 1992

Attest:

DOUGLAS B. COMER

Attesting Officer     Acting Commissioner of Patents and Trademarks